United States Patent [19]

Chen

[11] Patent Number: 5,308,400
[45] Date of Patent: May 3, 1994

[54] ROOM TEMPERATURE WAFER CLEANING PROCESS

[75] Inventor: Chao-Yang Chen, Taipei, Taiwan

[73] Assignee: United Microelectronics Corporation, Hsinchu, Taiwan

[21] Appl. No.: 939,615

[22] Filed: Sep. 2, 1992

[51] Int. Cl.$^5$ .................. C23G 1/02; C23G 5/032; B08B 3/02
[52] U.S. Cl. .............................. 134/2; 134/3; 134/26; 134/28; 134/29; 134/34; 134/30
[58] Field of Search ............. 134/2, 3, 26, 28, 29, 134/34

[56] References Cited

U.S. PATENT DOCUMENTS

| | | | |
|---|---|---|---|
| 4,264,374 | 4/1981 | Beyer et al. | 134/28 |
| 4,569,722 | 2/1986 | Maury et al. | 156/657 |
| 4,778,532 | 10/1988 | McConnell et al. | 134/26 |
| 5,129,955 | 7/1992 | Tanaka | 134/2 |
| 5,176,756 | 1/1993 | Nakashima et al. | 134/2 |

FOREIGN PATENT DOCUMENTS 0007133  1/1987  Japan.

OTHER PUBLICATIONS

T. Ohmi, H. Mishima, T. Mizuniwa & M. Abe, "Developing Contamination-Free Cleaning and Drying Technologies", in Microcontamination, May 1989, pp. 25-32, 108.

*Primary Examiner*—José G. Dees
*Assistant Examiner*—Dwayne C. Jones
*Attorney, Agent, or Firm*—George O. Saile

[57] ABSTRACT

A new method of removing particles from the surface of a wafer is described. The key to the method is a room temperature ammonium hydroxide-hydrogen peroxide solution. The wafer is immersed in hydrofluoric acid, then, while the wafer is still wet, it is either immersed in an ammonium hydroxide-hydrogen peroxide solution or the ammonium hydroxide-hydrogen peroxide solution is sprayed onto the wafer. Since the cleaning solution is at room temperature, the process is safer. The bath life is prolonged because the solution does not break down as it would at higher temperatures.

20 Claims, 2 Drawing Sheets

ROOM TEMPERATURE WAFER CLEANING PROCESS

BACKGROUND OF THE INVENTION

(1) Field of the Invention

The invention relates to a method of cleaning an integrated circuit and more particularly, to a method of cleaning an integrated circuit so as to remove particles contaminating said integrated circuit.

(2) Description of the Prior Art

In the manufacture of integrated circuits, it is necessary to remove silicon and silicon oxide at various stages of the fabrication process, especially after wafers have gone through a hydrofluoric acid etching process. The standard method of removal is illustrated by the process flow in FIG. 1. Step 1 is immersion in hydrofluoric acid wherein the silicon oxide is etched away. This is followed by a quick dump rinse, 2, in de-ionized water followed by a spin dry, 3.

The problem with this method is that unwanted particles remain on the wafer. Many of these particles may be the result of the interaction of the silicon with the hydrofluoric acid. When the wafer is immersed in the hydrofluoric acid, silicon hydride is formed which absorbs particles. Silicon hydride formed on the wafer surface may also attract particles. Particles can be picked up from the hydrofluoric acid tank.

Workers in the field generally use the removal process illustrated in FIG. 2. The first three steps of the original process are used. Step 1 is the hydrofluoric acid immersion, followed by step 2—quick dump rinse with de-ionized water, and step 3—spin dry. Step 4 is a high temperature RCA 1 clean. This is usually a solution of ammonium hydroxide—hydrogen peroxide at more than 75° C. The wafers are typically immersed in the solution for about 10 minutes. The high temperature is required to break the chemical bonds which have been formed between the silicon wafer and the particles. A second quick dump rinse, 5, and spin dry, 6, complete the removal process. The article "Developing Contamination-Free Cleaning and Drying Technologies," (Tadahiro Ohmi, Hiroyuki Mishima, Tetsuo Mizuniwa, and Mitsuo Abe in *Microcontamination,* May 1989, pp. 25-32,108) discusses such an ammonia-hydrogen peroxide RCA cleaning system. These processes still result in particle counts which are too high.

SUMMARY OF THE INVENTION

A principal object of the present invention is to provide an effective and very manufacturable method of removing particles from the surface of a wafer.

Another object of the present invention is to provide a method of removing particles from the surface of a wafer which results in a minimum of particles remaining on the wafer.

Another object of the present invention is to provide a method of removing particles from the surface of a wafer which method can be used at many stages of the manufacturing process.

In accordance with the objects of this invention a new method of removing particles from the surface of a wafer is achieved. The key to the method is a room temperature ammonium hydroxide-hydrogen peroxide solution. The wafer is immersed in hydrofluoric acid, then, while the wafer is still wet, it is either immersed in an ammonium hydroxide-hydrogen peroxide solution or the ammonium hydroxide-hydrogen peroxide solution is sprayed onto the wafer. Since the cleaning solution is at room temperature, the process is safer. The bath life is prolonged because the solution does not break down as it would at higher temperatures. For example, the hydrogen peroxide would break down into oxygen and water at high temperatures.

In the immersion method, only one quick dump rinse followed by a spin dry is necessary following the ammonium hydroxide-hydrogen peroxide immersion. In the spray method, after the tank is filled with the ammonium hydroxide-hydrogen peroxide solution, nitrogen and the ammonium hydroxide-hydrogen peroxide solution are bubbled for 20 to 30 seconds followed by a powerful spray and bubbling for 40 to 60 seconds. This is followed by quickly draining the fluid while the spray remains on. The powerful agitation and draining steps are repeated one or more times. A quick dump rinse and spin dry complete the particle removal process.

The particle removal method of the present invention can be used to remove particles from the silicon wafer prior to formation of the gate dielectric. This method can be used in many other points in the fabrication process such as in well etching, field oxidation, gate oxidation, polysilicon formation, source/drain ion implant or diffusion, and contact formation.

BRIEF DESCRIPTION OF THE DRAWINGS

In the accompanying drawings forming a material part of this description, there is shown.

DESCRIPTION OF THE PREFERRED EMBODIMENTS

Figure 3:
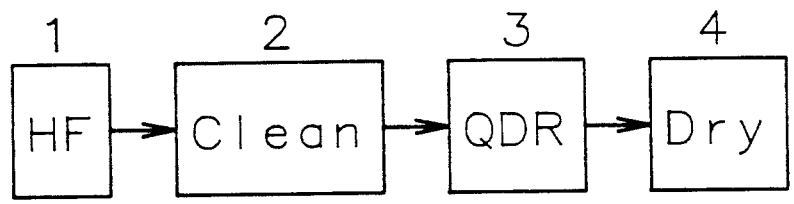
FIG. 3 schematically illustrates in cross-sectional representation the process flow of the immersion method which is the first preferred embodiment of the present invention.

Referring now more particularly to FIG. 3, there is shown an illustration of the process flow of the first preferred embodiment of the present invention—the immersion method. The wafer cassette is immersed in hydrofluoric acid, step 1, which is typically 10 parts water to one part hydrofluoric acid for a conventional period of time. While the wafers are still wet with the hydrofluoric acid, the wafer cassette is moved into a tank of liquid ammonium hydroxide-hydrogen peroxide, step 2, at room temperature. The preferred concentration of the solution is ammonium hydroxide (1):hydrogen peroxide (1):water (5) or ammonium hydroxide (0.25):hydrogen peroxide (1):water (5). The silicon surface is hydrophobic, so there are droplets of hydrofluoric acid only on the surface of the wafers. The wafers remain in the ammonium hydroxide-hydrogen peroxide solution for about 10 minutes with no agitation.

The wafers are put through a quick dump rinse, 3 followed by a spin dry, 4. No second rinse or spin dry is required. The particle count is much better than that for the normal particle removal process and comparable to that for the prior art high temperature RCA 1 particle removal process after spin dry. This process is safer than the high temperature RCA 1 process and has fewer steps.

Figure 4:
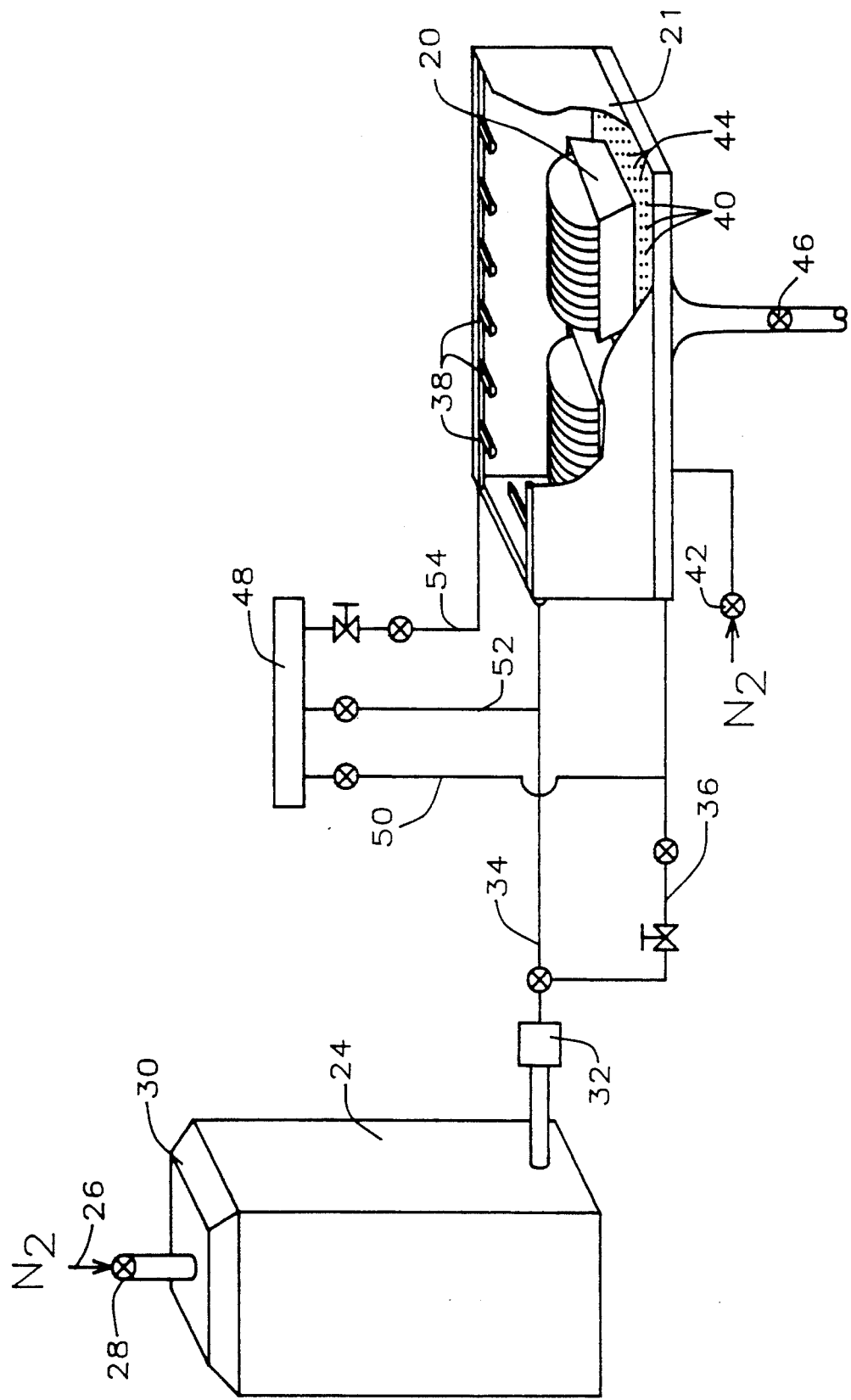
FIG. 4 schematically illustrates in cross-sectional representation the spray module of the second preferred embodiment of the present invention.

Referring now to FIG. 4, there is shown an illustration of the second preferred embodiment of the present invention—the spray module method. As in the first preferred embodiment, the wafer cassette is immersed in hydrofluoric acid which is typically 10 parts water to one part hydrofluoric acid for a conventional period of time. While the wafers are still wet with the hydrofluoric acid, the wafer cassette 21 is moved into the combination clean/quick dump rinse tank 20.

The tank 20 is filled from the bottom with an ammonium hydroxide-hydrogen peroxide solution. The preferred concentration of the solution is ammonium hydroxide (1):hydrogen peroxide (1):water (5) or ammonium hydroxide (0.25):hydrogen peroxide (1):water (5). This solution is stored in tank 24. The solution could be pumped from the storage tank 24 into the cleaning tank 20, but a pump could be an additional source of dirt particles. It is preferable to use nitrogen gas 26 at high pressure to move the solution through the system. This requires a valve 28 and cap 30 to hold the pressure in the storage tank. The ammonium hydroxide-hydrogen peroxide solution passes through a filter 32. One such filter is produced by Gelman Sciences Products, EA92FIMV Chemvent Cartridge, 0.2 micrometer 10 inch SOE. The solution is passed through pipe 34 and out through spray nozzles 38 at the top of tank 20, or through pipe 36 and up through bubbling holes 40 in the bottom of tank 20.

After the tank has been filled with the ammonium hydroxide-hydrogen peroxide sprayed through nozzles 38, it is bubbled with ammonium hydroxide-hydrogen peroxide through holes 40 and nitrogen gas 42 through holes 44 in the bottom of tank 20. This bubbling has a duration of between about 20 and 30 seconds. Bubbling holes 40 and 44 could be shared by both the ammonium hydroxide-hydrogen peroxide arid nitrogen gas.

Very high spray and bubbling through nozzles 38 and holes 40 and 44 produce great agitation for a duration of between about 40 and 60 seconds.

Drain 46 is opened and the fluid is quickly drained from the tank within 2 to 3 seconds. The fluid could be drained through holes 40 and 44 or through a central drain hole, not shown. Ammonium hydroxide-hydrogen peroxide spray continues during the draining operation. Drain 46 is closed and the great agitation and draining steps are repeated, more than once if desired.

De-ionized water is stored in tank 48. The water can flow through pipe 50 to bubbling holes 40 or through pipes 52 and 54 to spray nozzles 38. This water is used for a conventional quick dump rinse of the wafer cassettes following the particle removal process. The wafers are spun dry in a conventional spin dry procedure.

An advantage of the spray module process is that it is an easier process for the operator because all operations take place within the combination tank. Only 2 to 3 minutes of ammonium hydroxide-hydrogen peroxide spray are required versus 10 minutes of immersion required in the immersion method, so that the particle removal process takes less time and consumes less solution.

The following Examples are given to show the important features of the invention and to aid in the understanding thereof and variations may be made by one skilled in the art without departing from the spirit and scope of the invention.

EXAMPLE 1

Table 1 shows the particle counts of different sizes after the original particle removal method and the high temperature RCA 1 particle removal method of the prior art as compared to the counts after the immersion method of the present invention.

TABLE 1

| particle size (microns) | Original | High temp RCA | Immersion |
| --- | --- | --- | --- |
| <0.3 | 4922 | 95 | 114 |
| 0.5–1 | 565 | 4 | 4 |
| >1.0 | 339 | 9 | 13 |

It can be seen from Table 1 that the particle counts for the immersion method of the present invention are virtually identical to the counts after the high temperature RCA 1 method. The immersion method of the present invention requires fewer processing steps and is safer than the high temperature RCA 1 method because of the lower temperatures.

EXAMPLE 2

Table 2 details the sequence of steps in the particle removal process of the spray module method of the present invention.

TABLE 2

| STEP | TIME (sec) | FUNCTION |
| --- | --- | --- |
| 1 | 5 | drain |
| 2 | 20 | pump N$_2$, NH$_4$OH bubbling |
| 3 | 30 | pump N$_2$, NH$_4$OH bubbling, NH$_4$OH spray |
| 4 | 5 | pump N$_2$, NH$_4$OH spray, drain |
| 5 | 30 | pump N$_2$, NH$_4$OH bubbling, NH$_4$OH spray |
| 6 | 10 | de-ionized water spray, drain |
| 7 | 10 | de-ionized water bubbling |
| 8 | 10 | N$_2$, de-ionized water bubbling, de-ionized water spray, drain |
| 9 | 10 | N$_2$, de-ionized water bubbling |
| 10 | 15 | de-ionized water spray, drain |
| 11 | 30 | de-ionized water bubbling, de-ionized water spray |
| 12 | 30 | N$_2$, de-ionized water bubbling, de-ionized water spray |
| 13 | 10 | N$_2$, de-ionized water bubbling |
| 14 | 15 | de-ionized water spray, drain |
| 15 | 30 | de-ionized water bubbling, de-ionized water spray |
| 16 | 30 | N$_2$, de-ionized water bubbling, de-ionized water spray |
| 17 | 10 | N$_2$, de-ionized water bubbling |

Figure 1:
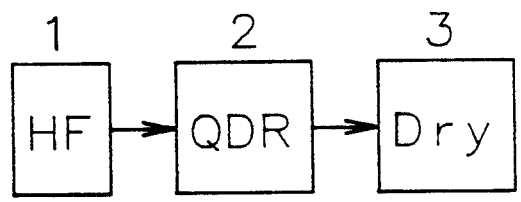
FIGS. 1 and 2 schematically illustrate in cross-sectional representation the process flow of prior art particle removal methods.
Figure 2:
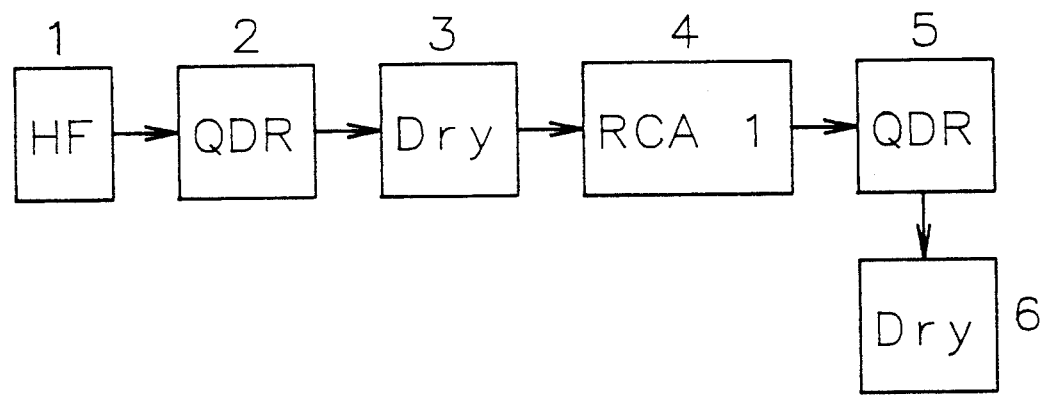

Table 3 shows the number of particles less than or equal to 1 micron in size that were found on the wafers before and after the test. Control wafer 1 was a blank silicon wafer which was run through the spray module method of the present invention, rinsed, and spin dried, but was not immersed in hydrofluoric acid. Control wafer 2 was a blank silicon wafer which was immersed in hydrofluoric acid, then cleaned following the original cleaning process illustrated by FIG. 1. Control wafer 3 was a blank silicon wafer which was immersed in hydrofluoric acid, then run through the spray module cleaning process of the present invention. Test wafers 4 through 8 were "dirty" wafers which had never been oxidized, but had picked up particles from other equipment, such as a dry etcher, sputterer, etc. These 5 wafers were immersed in hydrofluoric acid and run together through the spray module process of the present invention. Note that in the spray module process used for this experiment, a diaphram pump was used to move the ammonium hydroxide-hydrogen peroxide solution from the storage tank to the cleaning tank and no filter was used on the solution.

TABLE 3

| Test Wafer | Particles before test | Particles after test |
|---|---|---|
| 1 - no HF | 3 | 7 |
| 2 - orig. process | 5 | 1266 |
| 3 - spray (clean) | 3 | 28 |
| 4 - spray (dirty) | 776 | 109 |
| 5 - spray (dirty) | 1024 | 173 |
| 6 - spray (dirty) | 926 | 270 |
| 7 - spray (dirty) | 673 | 122 |
| 8 - spray (dirty) | 720 | 215 |

It can be seen that improved particle counts resulted from the use of the spray module process of the present invention. These particle counts are not satisfactory, but they can be improved by using a filter on the ammonium hydroxide-hydrogen peroxide solution and by replacing the diaphram pump with high pressure nitrogen to move the solution into the cleaning tank, as described and illustrated in FIG. 4. Additional improvements in particle counts may be made by repeating the cleaning and rinsing process multiple times and by recirculating the ammonium hydroxide-hydrogen peroxide solution.

While the invention has been particularly shown and described with reference to the preferred embodiments thereof, it will be understood by those skilled in the art that various changes in form and details may be made without departing from the spirit and scope of the invention.

What is claimed is:

1. The method of removing surface particles from a wafer comprising:
   immersing said wafer in a hydrofluoric acid solution;
   while said wafer is still wet, removing surface particles from said wafer using an ammonium hydroxide-hydrogen peroxide solution at room temperature;
   performing a quick dump rinse and spin dry on said wafer to complete said particle removal process.

2. The method of claim 1 wherein said ammonium hydroxide-hydrogen peroxide solution is ammonium hydroxide (1):hydrogen peroxide (1):water (5).

3. The method of claim 1 wherein said ammonium hydroxide-hydrogen peroxide solution is ammonium hydroxide (0.25):hydrogen peroxide (1):water (5).

4. The method of claim I wherein said removing surface particles is done by immersion in said ammonium hydroxide-hydrogen peroxide solution at room temperature for a duration of about 10 minutes.

5. The method of claim 1 wherein said removing surface particles is done by spraying said ammonium hydroxide-peroxide hydrogen peroxide solution at room temperature.

6. The method of claim 5 wherein said spraying and further comprising bubbling of ammonium hydroxide-hydrogen peroxide further comprises the steps of:
   spraying ammonium hydroxide-hydrogen peroxide onto said wafer from the top and bubbling from the bottom with ammonium hydroxide-hydrogen peroxide and nitrogen gas for a duration of between about 20 and 30 seconds;
   providing powerful spray and bubbling of ammonium hydroxide-hydrogen peroxide and bubbling with nitrogen gas for great agitation for a further duration of between about 40 and 60 seconds;
   draining said solution while said spray is still provided; and
   repeating said great agitation and draining steps.

7. The method of claim 6 wherein said great agitation and draining steps may be repeated more than once.

8. The method of removing surface particles from a wafer comprising:
   immersing said wafer in a hydrofluoric acid solution;
   while said wafer is still wet, immersing said wafer in an ammonium hydroxide-hydrogen peroxide solution at room temperature without bubbling said solution; and
   performing a quick dump rinse and spin dry on said wafer to complete said particle removal process.

9. The method of claim e wherein said ammonium hydroxide-hydrogen peroxide solution is ammonium hydroxide (1):hydrogen peroxide (1):water (5).

10. The method of claim 8 wherein said ammonium hydroxide-hydrogen peroxide solution is ammonium hydroxide (0.25):hydrogen peroxide (1):water (5).

11. The method of claim 8 wherein said ammonium hydroxide-hydrogen peroxide immersion is at room temperature and has a duration of about 10 minutes.

12. The method of removing surface particles from a wafer comprising:
   immersing said wafer in a hydrofluoric acid solution;
   inserting said wafer into a combined clean and quick dump rinse tank equipped with top and bottom spray nozzles and a drain while said wafer is still wet;
   filling said tank with ammonium hydroxide-hydrogen hydrogen peroxide solution and bubbling with nitrogen gas and said ammonium hydroxide - hydrogen peroxide solution;
   providing powerful spray and bubbling of ammonium hydroxide-hydrogen peroxide and bubbling with nitrogen gas in said tank for great agitation;
   draining said solution from said tank while said spray is still provided;
   closing said drain and repeating said great agitation and draining steps; and
   performing a quick dump rinse and spin dry on said wafer to complete said particle removal process.

13. The method of claim 12 wherein said solution is ammonium hydroxide (1):hydrogen peroxide (1):water (5).

14. The method of claim 12 wherein said ammonium hydroxide-hydrogen peroxide solution is ammonium hydroxide (0.25):hydrogen peroxide (1):water (5).

15. The method of claim 12 wherein said tank is filled from the bottom and bubbled from the bottom for a duration of between about 20 and 30 seconds.

16. The method of claim 12 wherein said powerful spray and bubbling is performed for a duration of between about 40 and 60 seconds.

17. The method of claim 12 wherein said draining of fluid is done quickly for a duration of between about 2 and 3 seconds.

18. The method of claim 12 wherein said great agitation and draining steps may be repeated more than once.

19. The method of claim 12 wherein said quick dump rinse may be performed more than once.

20. The method of claim 12 wherein said ammonium hydroxide-hydrogen peroxide solution is filtered before it enters said tank.

* * * * *